(12) United States Patent
Mahajani et al.

(10) Patent No.: US 7,897,208 B2
(45) Date of Patent: *Mar. 1, 2011

(54) LOW TEMPERATURE ALD SIO$_2$

(75) Inventors: Maitreyee Mahajani, Saratoga, CA (US); Yi-Chiau Huang, Fremont, CA (US); Brendan McDougall, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/788,131

(22) Filed: May 26, 2010

(65) Prior Publication Data

US 2010/0227061 A1 Sep. 9, 2010

Related U.S. Application Data

(63) Continuation of application No. 11/559,491, filed on Nov. 14, 2006, now Pat. No. 7,749,574.

(51) Int. Cl.
*C23C 16/00* (2006.01)
*H05H 1/24* (2006.01)

(52) U.S. Cl. ............... 427/248.1; 427/569; 427/255.29

(58) Field of Classification Search ............. 427/248.1, 427/569, 255.29
See application file for complete search history.

(56) References Cited

U.S. PATENT DOCUMENTS

| | | | |
|---|---|---|---|
| 6,090,442 A | 7/2000 | Klaus et al. | |
| 6,391,803 B1 | 5/2002 | Kim et al. | |
| 6,548,047 B1 | 4/2003 | Unger | |
| 6,613,383 B1 | 9/2003 | George et al. | |
| 6,713,177 B2 | 3/2004 | George et al. | |
| 6,716,412 B2 | 4/2004 | Unger | |
| 6,818,250 B2 | 11/2004 | George et al. | |
| 6,872,843 B2 | 3/2005 | Schottek et al. | |
| 6,913,827 B2 | 7/2005 | George et al. | |
| 6,958,174 B1 | 10/2005 | Klaus et al. | |
| 6,969,539 B2 | 11/2005 | Gordon et al. | |
| 6,992,019 B2 | 1/2006 | Lee et al. | |

(Continued)

FOREIGN PATENT DOCUMENTS

WO WO-2005/117086 A1 12/2005

OTHER PUBLICATIONS

Notice to File a Response dated Sep. 16, 2009 for Korean Patent Application No. 2007-0112572 (APPM/010881 KR).

(Continued)

*Primary Examiner*—Timothy H Meeks
*Assistant Examiner*—Kelly M Gambetta
(74) *Attorney, Agent, or Firm*—Patterson & Sheridan, LLP

(57) ABSTRACT

The present invention generally comprises a silicon dioxide atomic layer deposition method. By providing pyridine as a catalyst, water may be utilized as the oxidization source while depositing at a low temperature. Prior to exposing the substrate to the water, the substrate may be exposed to a pyridine soak process. Additionally, the water may be co-flowed to the chamber with the pyridine through separate conduits to reduce interaction prior to entering the chamber. Alternatively, the pyridine may be co-flowed with a silicon precursor that does not react with pyridine.

20 Claims, 6 Drawing Sheets

U.S. PATENT DOCUMENTS

| | | | |
|---|---|---|---|
| 7,052,990 | B2 | 5/2006 | Kim |
| 7,077,904 | B2 | 7/2006 | Cho et al. |
| 7,084,076 | B2 | 8/2006 | Park et al. |
| 7,087,485 | B2 | 8/2006 | Seidl et al. |
| 7,749,574 | B2 * | 7/2010 | Mahajani et al. ............ 427/569 |
| 2002/0018849 | A1 | 2/2002 | George et al. |
| 2004/0018694 | A1 | 1/2004 | Lee et al. |
| 2004/0084774 | A1 | 5/2004 | Li et al. |
| 2004/0126983 | A1 * | 7/2004 | Kim ........................ 438/396 |
| 2004/0180557 | A1 | 9/2004 | Park et al. |
| 2004/0194691 | A1 | 10/2004 | George et al. |
| 2005/0012975 | A1 | 1/2005 | George et al. |
| 2005/0037565 | A1 | 2/2005 | Seidl et al. |
| 2005/0048765 | A1 | 3/2005 | Kim |
| 2005/0056219 | A1 | 3/2005 | Dip et al. |
| 2005/0095830 | A1 | 5/2005 | Weidman et al. |
| 2005/0136193 | A1 | 6/2005 | Weidman et al. |
| 2005/0161338 | A1 | 7/2005 | Fang et al. |
| 2005/0227007 | A1 | 10/2005 | Bradley et al. |
| 2005/0271813 | A1 | 12/2005 | Kher et al. |
| 2006/0040510 | A1 | 2/2006 | Lee et al. |
| 2006/0070574 | A1 | 4/2006 | Derderian et al. |
| 2006/0090694 | A1 | 5/2006 | Cho et al. |
| 2006/0141155 | A1 | 6/2006 | Gordon et al. |
| 2008/0085612 | A1 * | 4/2008 | Smythe et al. .............. 438/787 |

OTHER PUBLICATIONS

Cameron, et al. "Atomic Layer Deposition of $SiO_2$ and $TiO_2$ in Alumina Tubular Membranes," Langmuir, vol. 16, No. 19, American Chemical Society, 2000 pp. 7435-7444.

Du, et al. "$SiO_2$ Film Growth at Low Temperature by Catalyzed Atomic Layer Deposition in a Viscous Flow Reactor," Thin Solid Films, 491, (2005), pp. 43-53.

Elam, et al. "Nucleation and Growth During Tungsten Atomic Layer Deposition on $SiO_2$ Surfaces," Thin Solid Films, 386, (2001), pp. 41-52.

Ferguson, et al. "ALD of $SiO_2$ at Room Temperature Using TEOS and $H_2O$ with $NH_3$ as the Catalyst," Journal of the Electrochemical Society, 151, (8), pp. G528-G535 (2004).

Ferguson, et al. "Atomic Layer Deposition of $Al_2O_3$ and $SiO_2$ on BN Particles Using Sequential Surface Reactions," Applied Surface Science, 162-163, (2000), pp. 280-292.

Ferguson, et al. "Atomic Layer Deposition of $SiO_2$ Films on BN Particles Using Sequential Surface Reactions," Chem. Mater., vol. 12, No. 11, 2000, pp. 3472-3480.

Groner, et al. "High-$k$ Dielectrics Grown by Atomic Layer Deposition: Capacitor and Gate Applications," Interlayer Dielectrics for Semiconductor Technologies, Chapter 10, Elsevier Inc., 2003, pp. 327-348.

Hausmann, et al. "Rapid Vapor Deposition of Highly Conformal Silica Nanolaminates," Science, vol. 298, Oct. 11, 2002, pp. 402-406.

He, et al. "Pulsed Deposition of Silicate Films," Journal of Applied Physics, vol. 94, No. 5, Sep. 1, 2003, pp. 3657-3659.

Jiang, et al. "Infrared Method for In Situ Studies of Polymer/Surfactant Adsorption on Silica Powders from Aqueous Solution," Applied Spectroscopy, vol. 57, No. 11, 2003, pp. 1419-1424.

Kang, et al. "Infrared Spectroscopic Study of Atomic Layer Deposition Mechanism for Hafnium Silicate Thin Films Using $HfCl_2$ [$N(SiMe_3)_2$]$_2$ and $H_2O$," J. Vac. Sci. Technol. A 22(6), Nov./Dec. 2004, American Vacuum Society, pp. 2393-2397.

Klaus, et al. "Atomic Layer Controlled Growth of $SiO_2$ Films Using Binary Reaction Sequence Chemistry," Appl. Phys. Lett. 70(9), Mar. 3, 1997. pp. 1092-1094.

Klaus, et al. "Atomic Layer Deposition of $SiO_2$ at Room Temperature Using $NH_3$-Catalyzed Sequential Surface Reactions," Surface Science 447 (2000) Elsevier Science, pp. 81-90.

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999), pp. 435-448.

Klaus, et al. "Growth of $SiO_2$ at Room Temperature with the Use of Catalyzed Sequential Half-Reactions," SCIENCE, vol. 278, Dec. 12, 1997, pp. 1934-1936.

Klaus, et al. "$SiO_2$ Chemical Vapor Deposition at Room Temperature Using $SiCl_4$ and $H_2O$ with an $NH_3$ Catalyst," Journal of The Electrochemical Society, 147 (7), 2000, pp .2658-2664.

McCool, et al. "Self-Limited Pore Size Reduction of Mesoporous Silica Membranes via Pyridine-Catalyzed Silicon Dioxide ALD," Chem. Vap. Deposition, 2004, vol. 10, No. 4, pp. 190-194.

McCool, et al. "Synthesis and Characterization of Silica Membrane Prepared by Pyridine-Catalyzed Atomic Layer Deposition," Ind. Eng. Chem. Res., vol. 43, No. 10, 2004, pp. 2478-2484.

Morishita, et al. "New Substances for Atomic-Layer Deposition of Silicon Dioxide," Journal of Non-Crystalline Solids, vol. 187 (1995), pp. 66-69.

Rana, et al. "Interactions of Moisture and Organic Contaminants with $SiO_2$ and $ZrO_2$ Gate Dielectric Films," Applied Surface Science, vol. 205, (2003), pp. 160-175.

Yamaguchi, et al. "Atomic-Layer Chemical-Vapor-Deposition of Silicon Dioxide Films with an Extremely Low Hydrogen Content," Applied Surface Science, 130-132 (1998), pp. 202-207.

European Search Report dated Dec. 21, 2007 for European Application No. 07021810.2. (APPM/010881EP).

Chinese Office Action for Chinese Application No. 2007101703305 (APPM/10881CN) dated Mar. 13, 2009.

European Office Action for European Patent Application No. 07021810.2-2122 (APPM/10881EP) dated Apr. 6, 2009.

Jill Svenja Becker, Ph.D. Thesis Harvard University, Cambridge, MA (2002), pp. 25, 64 and 106-117.

Matheson Tri-Gas, Inc., Material Safety Data Sheet for Pyridine, Jan. 1989.

* cited by examiner

LOW TEMPERATURE ALD SIO₂

CROSS-REFERENCE TO RELATED APPLICATIONS

This application is a continuation of and claims benefit to U.S. patent application Ser. No. 11/559,491, filed Nov. 14, 2006, now U.S. Pat. No. 7,749,574 which is herein incorporated by reference.

BACKGROUND OF THE INVENTION

1. Field of the Invention

Embodiments of the present invention generally relate to methods for depositing silicon dioxide by atomic layer deposition (ALD).

2. Description of the Related Art

In the field of semiconductor processing, flat-panel display processing or other electronic device processing, vapor deposition processes have played an important role in depositing materials onto substrates. As the geometries of electronic devices continue to shrink and the density of devices continues to increase, the size and aspect ratio of the features are becoming more aggressive. Accordingly, conformal deposition of materials to form these devices is becoming increasingly important.

While conventional chemical vapor deposition (CVD) has proved successful for device geometries and aspect ratios down to about 0.15 μm, the more aggressive device geometries require an alternative deposition technique. One technique that is receiving considerable attention is ALD. During an ALD process, reactant gases are sequentially introduced into a process chamber containing a substrate. Generally, a first reactant is pulsed into the process chamber and is adsorbed onto the substrate surface. A second reactant is then pulsed into the process chamber and reacts with the first reactant to form a deposited material. A purge step may be carried out between the delivery of each reactant gas. The purge step may be a continuous purge with a carrier gas or a pulse purge between the delivery of the reactant gases.

The formation of silicon dioxide by ALD is a process that is known in the art. In forming silicon dioxide by ALD, a silicon precursor may be pulsed into the chamber followed by an oxidizing source. When water is used as the oxidizing source, the ALD process typically requires a high temperature and a longer exposure time due to the moderate reactivity of water.

Therefore, there is a need in the art for a method and apparatus for depositing silicon dioxide using water in an ALD at a low temperature.

SUMMARY OF THE INVENTION

The present invention generally comprises a silicon dioxide ALD method. By providing pyridine as a catalyst, water may be utilized as the oxidization source while depositing at a low temperature. Prior to exposing the substrate to the water, the substrate may be exposed to a pyridine soak process. Additionally, the water may be co-flowed to the chamber with the pyridine through separate conduits to reduce interaction prior to entering the chamber. Alternatively, the pyridine may be co-flowed with a silicon precursor that does not react with pyridine.

In one embodiment, the invention comprises a silicon dioxide deposition method comprising positioning a substrate in a chamber, exposing the substrate to a silicon precursor, exposing the substrate to a pyridine soak, and exposing the substrate to an oxidizing source.

In another embodiment, the invention comprises a silicon dioxide deposition method comprising positioning a substrate in a chamber, exposing the substrate to a silicon precursor, and exposing the substrate to an oxidizing source and pyridine, the pyridine and then oxidizing source flowing into the chamber through separate inlets.

In yet another embodiment, the invention comprises a silicon dioxide deposition method comprising positioning a substrate in a chamber, exposing the substrate to hexachlorodisilane, and exposing the substrate to $H_2O$ and pyridine, the pyridine and $H_2O$ flowing into the chamber through separate inlets.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises a silicon dioxide ALD method. By providing pyridine as a catalyst, water may be utilized as the oxidization source while depositing at a low temperature. Prior to exposing the substrate to the water, the substrate may be exposed to a pyridine soak process. Additionally, the water may be co-flowed to the chamber with the pyridine through separate conduits to reduce interaction prior to entering the chamber. Alternatively, the pyridine may be co-flowed with a silicon precursor that does not react with pyridine.

Figure 1A:
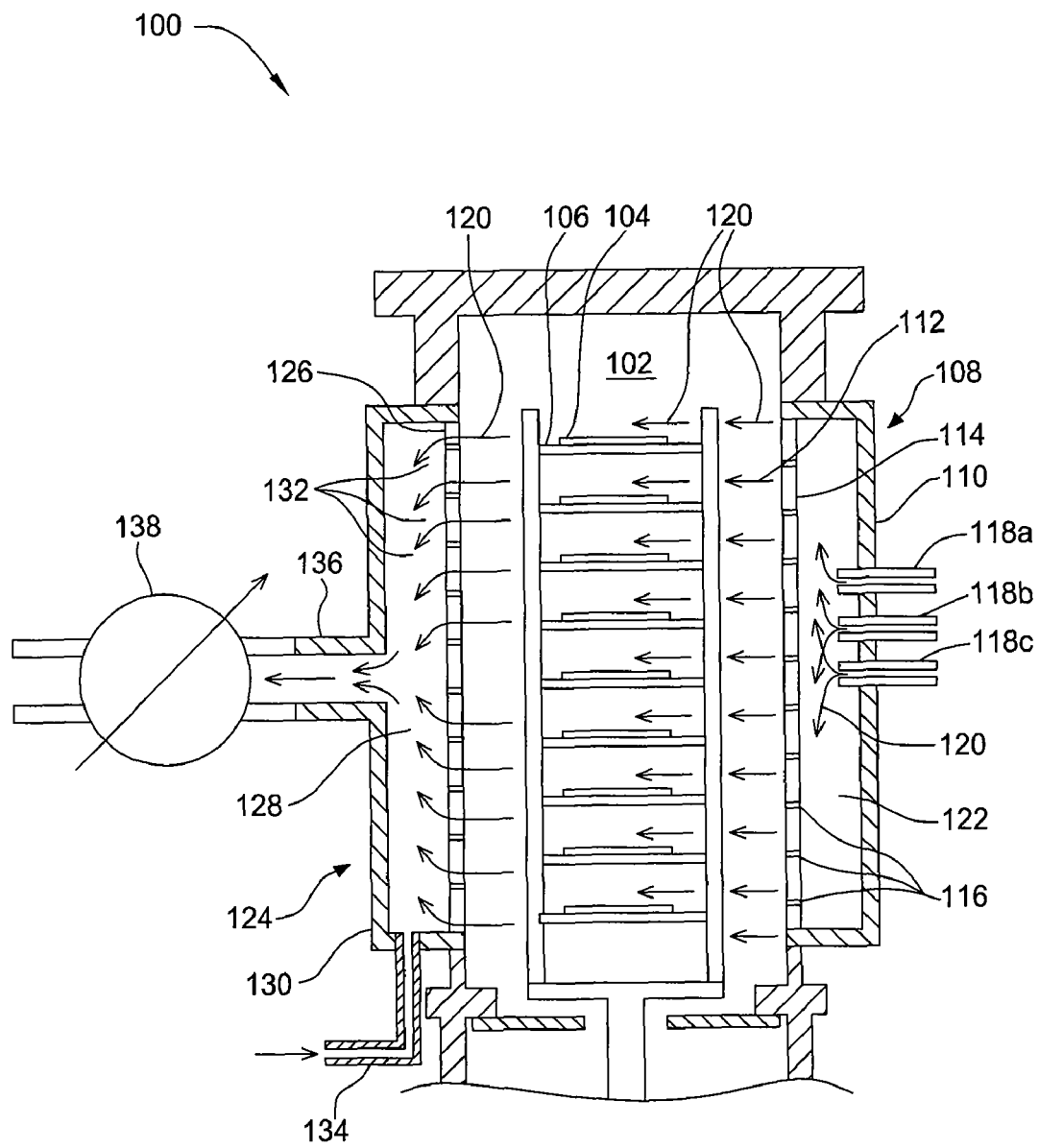
FIG. 1A is a schematic representation of an apparatus 100 according to one embodiment of the invention.

FIG. 1A is a schematic representation of an apparatus 100 according to one embodiment of the invention. The apparatus 100 comprises a vacuum chamber 102. The apparatus 100 may be a batch apparatus 100 that may contain one or more susceptors 106 upon which a substrate 104 may be placed. In one embodiment, the apparatus 100 may be a single substrate 104 apparatus. It is beneficial to process more than one substrate 104 simultaneously in order to increase throughput. One challenge posed with batch processes is maintaining a wafer to wafer uniformity.

Precursors may be fed to the apparatus 100 through an injector plenum 108. The injector plenum 108 may comprise a plenum wall 110 and an injection plate 114 that together surround and define an injection plenum chamber 122. The injection plate 114 has a plurality of holes 116 through which the precursor gas, purge gas, and carrier gas may flow 120 into the vacuum chamber 102. The injection plate 114 separates the injector plenum 108 from the vacuum chamber 102 so that the vacuum chamber 102 is the low pressure side 112 of the injector plenum 108. The precursors, purge gas, and carrier gas may be introduced to the injector plenum 108 through conduits 118a-118c.

The apparatus 100 may be exhausted through an exhaust plenum 124. The exhaust plenum may comprise an exhaust plate 126 and a plenum wall 130 that enclose and define an exhaust plenum chamber 128. A plurality of holes 132 may be present in the exhaust plate 126. The gases are exhausted from the exhaust plenum 124 through the exhaust port 136.

Additional gas may be introduced to the exhaust plenum 124 through conduit 134. The additional gas may abate or convert reaction by-products that may otherwise condense on surfaces of the exhaust plenum 124 and the vacuum chamber 102. A throttle valve 138 may control the vacuum chamber 102 pressure.

When forming silicon dioxide by ALD, a silicon precursor may be delivered to the apparatus 100. Exemplary silicon precursors useful for depositing silicon-containing materials include silanes, alkylsilanes, aminosilanes, alkylaminosilanes, silanols, or alkoxy silanes. For example, silicon precursors may include $(Me_2N)_4Si$, $(Me_2N)_3SiH$, $(Me_2N)_2SiH_2$, $(Me_2N)SiH_3$, $(Et_2N)_4Si$, $(Et_2N)_3SiH$, $(MeEtN)_4Si$, $(MeEtN)_3SiH$, $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, $MeSi(OH)_3$, $Me_2Si(OH)_2$, $(MeO)_4Si$, $(EtO)_4Si$, or derivatives thereof. Other alkylaminosilane compounds useful as silicon precursors include $(RR'N)_{4-n}SiH_n$, where R or R' are independently hydrogen, methyl, ethyl, propyl or butyl and n=0-3. Other alkoxy silanes may be described by the generic chemical formula $(RO)_{4-n}SiL_n$, where R=methyl, ethyl, propyl or butyl and L=H, OH, F, Cl, Br or I and mixtures thereof. Also, higher silanes may be used as silicon precursors within some embodiments of the invention. Higher silanes are disclosed in commonly assigned United States Patent Publication No. US 2004/0224089 A1, which is incorporated herein by reference in its entirety. In some embodiments, the silicon precursor may comprise tris(dimethylamino)silane (($Me_2N)_3SiH$ or Tris-DMAS), tetrakis(dimethylamino)silane (($Me_2N)_4Si$ or TDMAS) or other dialkylaminosilanes, while in other embodiments the silicon precursor may comprise silane ($SiH_4$). In yet another embodiment, the silicon precursor may comprise hexachlorodisilane (HCDS).

The oxidizing source for forming silicon dioxide in an ALD process may comprise oxygen ($O_2$), ozone ($O_3$), atomic-oxygen (O), hydrogen peroxide ($H_2O_2$), nitrous oxide ($N_2O$), nitric oxide (NO), dinitrogen pentoxide ($N_2O_5$), nitrogen dioxide ($NO_2$), water ($H_2O$), derivatives thereof or combinations thereof. In the exemplified embodiments, the oxidizing source comprises water ($H_2O$).

When using water as the oxidizing source, a catalyst is supplied to allow the ALD to proceed at a faster rate and a lower temperature than occurs in absence of the catalyst. Examples of catalysts that may be used include ammonia and pyridine. Pyridine and water may interact. Therefore, when water and pyridine are co-flowed together through the same input conduit to the chamber, the water and pyridine may interact prior to reaching the chamber. When the water and the pyridine interact, the pyridine no longer effectively functions as a catalyst and hence, the ALD deposition rate is not increased.

Figure 1B:
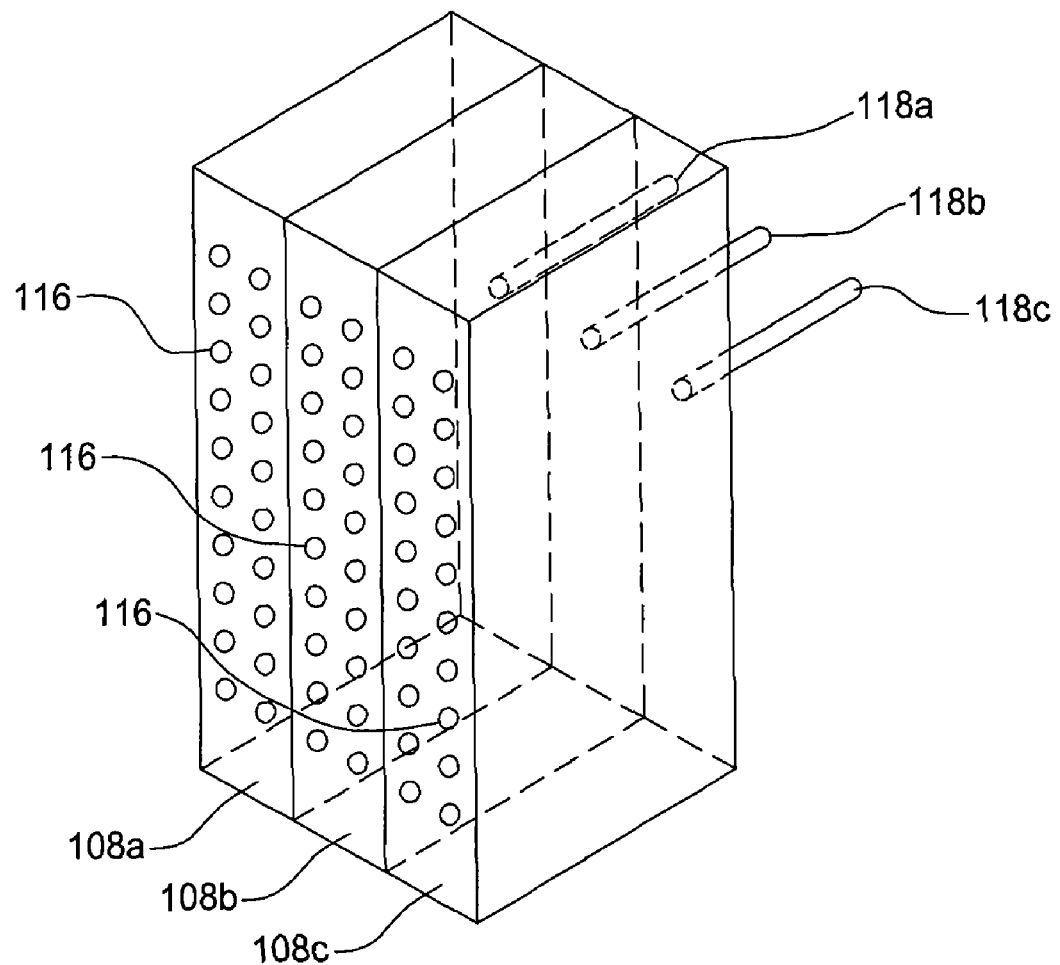
FIG. 1B is a schematic representation of injector plenums 108a-c according to one embodiment of the invention.

To prevent water and pyridine interaction prior to reaching the chamber, pyridine and water may be co-flowed to the chamber using separate feed conduits to separate injector plenums. FIG. 1B is a schematic representation of injector plenums 108a-c according to one embodiment of the invention. As shown in FIG. 1B, each conduit 118a-118c is fed to a separate injector plenum 108a-108c. Thus, pyridine-water interaction may be prevented until the pyridine and water reach the chamber.

Silicon precursors such as HCDS do not interact with pyridine. Therefore, the silicon precursor and the pyridine may be co-flowed to the chamber using the same conduit and injector plenum. In one embodiment, the pyridine and the silicon precursor may be flowed to the chamber using the same conduit and injector plenum. In another embodiment, the pyridine and the silicon precursor may be flowed to the chamber using separate conduit and injector plenums.

An alternative to co-flowing pyridine and water to the chamber using separate injector plenums and conduit is to expose the substrate to a pyridine soak prior to introducing the water to the chamber. A pyridine soak may comprise exposing the substrate to pyridine without introduction of other precursors or oxidizers such as water. The substrate may be exposed to the pyridine for a time sufficient to saturate the substrate with pyridine. In one embodiment, the pyridine soak occurs for greater than about 10 seconds. By performing a pyridine soak, sufficient catalyst may be present within the chamber and at the substrate surface to ensure that catalyst is present when the water precursor is introduced. Because the pyridine is already in the chamber, all of the pyridine may not be consumed by interacting with the water prior to reaching the chamber. When a pyridine soak is performed, additional pyridine may be co-flowed with the oxidizer and with the silicon precursor. In one embodiment, a pyridine soak is performed and continues to flow into the chamber as the silicon precursor and subsequently the water is delivered to the chamber. In another embodiment, the pyridine soak is performed and pyridine delivery is stopped during water delivery and silicon precursor delivery. The pyridine allows the reaction to occur at low temperatures such as from about room temperature to about 160 degrees Celsius. In one embodiment, the temperature is about 75 degrees Celsius.

Figure 2:
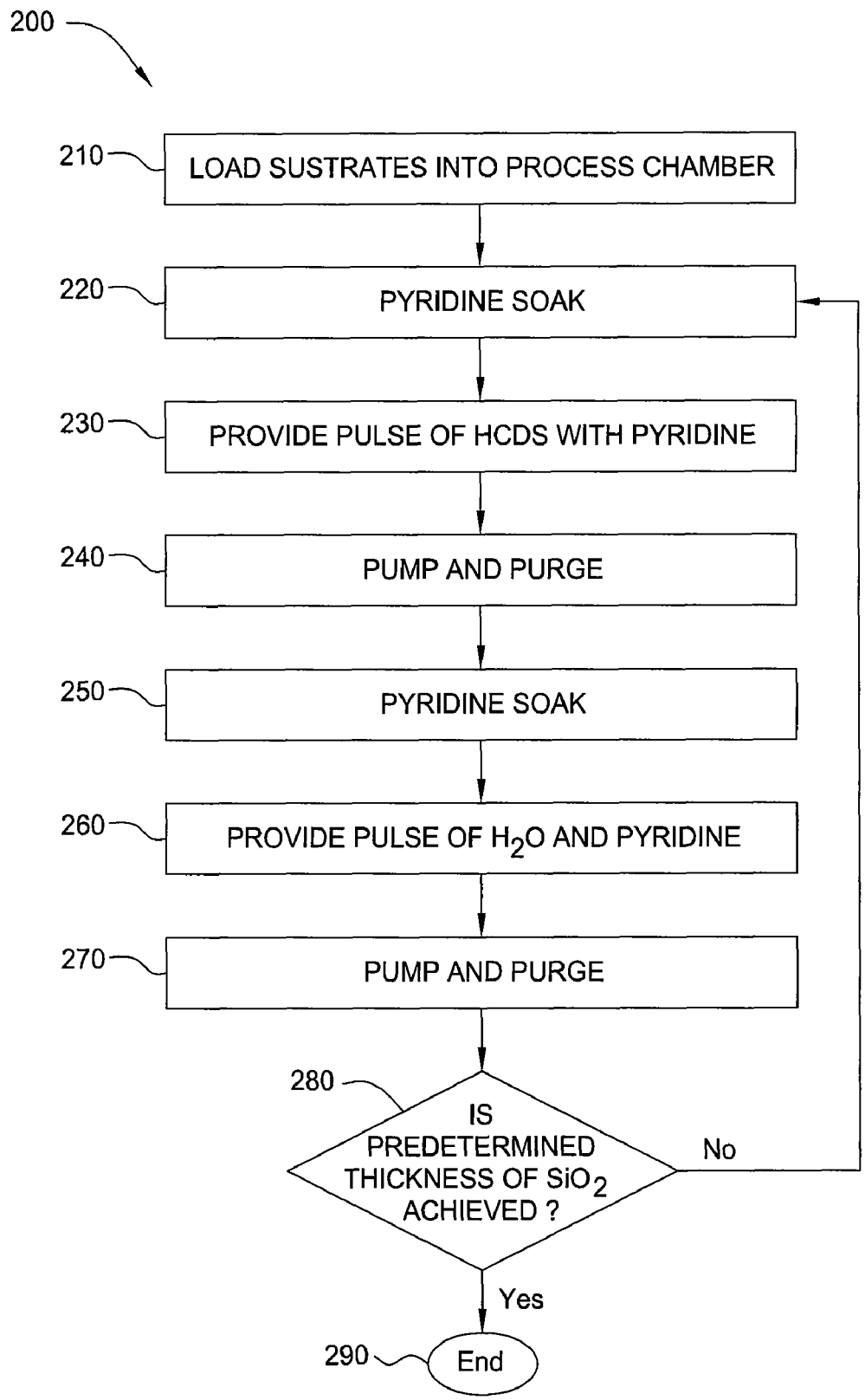
FIG. 2 is a flow chart 200 of a deposition method according to one embodiment of the invention.

FIG. 2 is a flow chart 200 of a deposition method according to one embodiment of the invention. Initially, one or more substrates may be placed into the process chamber (Step 210). The substrates may then be exposed to a pyridine soak (Step 220). The pyridine soak may occur for at least 10 seconds. Following the pyridine soak, a pulse of HCDS may be introduced to the chamber while the pyridine continues to flow into the chamber (Step 230). Alternatively, the pyridine flow may be stopped after the pyridine soak and then pulsed into the chamber with the HCDS.

Following the pulse of HCDS, the chamber may be purged by introducing a purge gas into the chamber (Step 240). Exemplary purge gases that may be used include inert gases such as argon. In one embodiment, the purge gas may comprise nitrogen. The chamber may be pumped to remove the purge gas and any remaining HCDS and pyridine that may be present in the chamber. In one embodiment, the pumping is not performed so that only a purging step is performed. Alternatively, the purge step may be eliminated so that the chamber is pumped to remove the HCDS and the pyridine. In one embodiment, the pumping may occur both before and after the purge gas introduction. In another embodiment, both the purging and the pumping may be repeated. The pumping and/or purging may occur a plurality of times. In yet another embodiment, the purging and the pumping may be combined into one step.

Following the pumping and/or purging, the substrate may be exposed to a second pyridine soak (Step 250). The second pyridine soak may occur under the same processing conditions present for the first pyridine soak discussed above. Following the pyridine soak, a pulse of $H_2O$ may be introduced to the chamber while the pyridine continues to flow into the chamber (Step 260). Alternatively, the pyridine flow may be stopped after the pyridine soak and then pulsed into the chamber with the $H_2O$. Because pyridine is already present within the chamber from the soak step, sufficient pyridine is present to act as a catalyst. Following the exposure of the substrate to $H_2O$, a second pumping and/or purging cycle (Step 270) may be performed under conditions as discussed above.

After the chamber has been pumped and/or purged, the thickness of the $SiO_2$ layer may be measured to determine if the predetermined thickness of $SiO_2$ has been reached (Step 280). If the predetermined thickness has not been reached, the deposition sequence may be repeated. If the predetermined thickness has been reached, then the process ends (Step 290).

Figure 3:
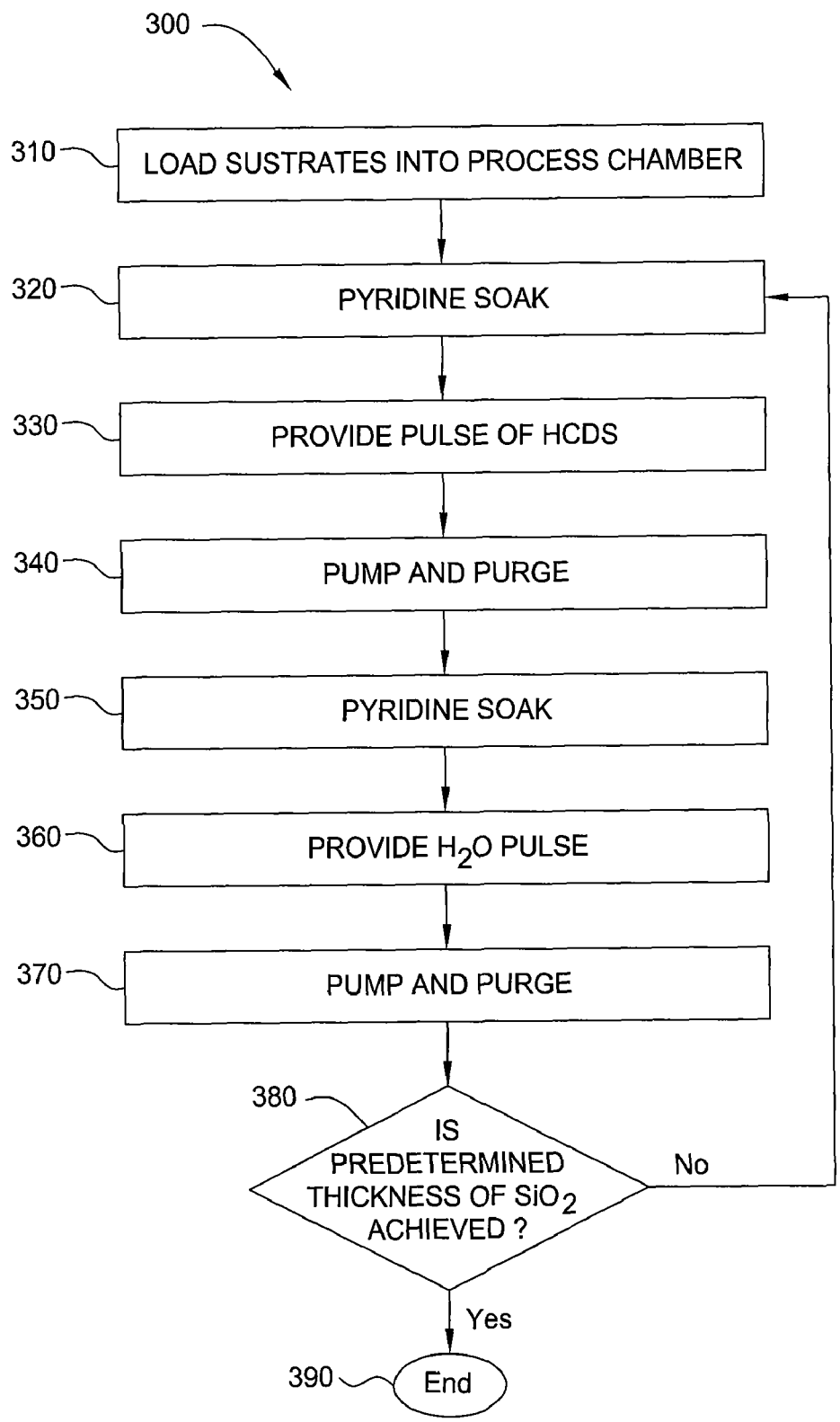
FIG. 3 is a flow chart 300 of a deposition method according to another embodiment of the invention.

FIG. 3 is a flow chart 300 of a deposition method according to another embodiment of the invention. Initially, one or more substrates may be placed into the process chamber (Step 310). The substrates may then be exposed to a pyridine soak (Step 320). The pyridine soak may occur for at least 10 seconds. Following the pyridine soak, a pulse of HCDS may be introduced to the chamber while no pyridine is delivered to the chamber (Step 330). Alternatively, the pyridine flow may be stopped after the pyridine soak and then pulsed into the chamber with the HCDS or the pyridine may continue to be delivered.

Following the pulse of HCDS, the chamber may be purged and/or pumped as discussed above (Step 340). Following the pumping and/or purging, the substrate may be exposed to a second pyridine soak (Step 350). The second pyridine soak may occur under the same processing conditions present for the first pyridine soak discussed above. Following the pyridine soak, the pyridine flow may be stopped and a pulse of $H_2O$ may be introduced to the chamber (Step 360). Following the exposure of the substrate to $H_2O$, a second pumping and/or purging cycle (Step 370) may be performed under conditions as discussed above.

After the chamber has been pumped and/or purged, the thickness of the $SiO_2$ layer may be measured to determine if the predetermined thickness of $SiO_2$ has been reached (Step 380). If the predetermined thickness has not been reached, the deposition sequence may be repeated. If the predetermined thickness has been reached, then the process ends (Step 390).

Figure 4:
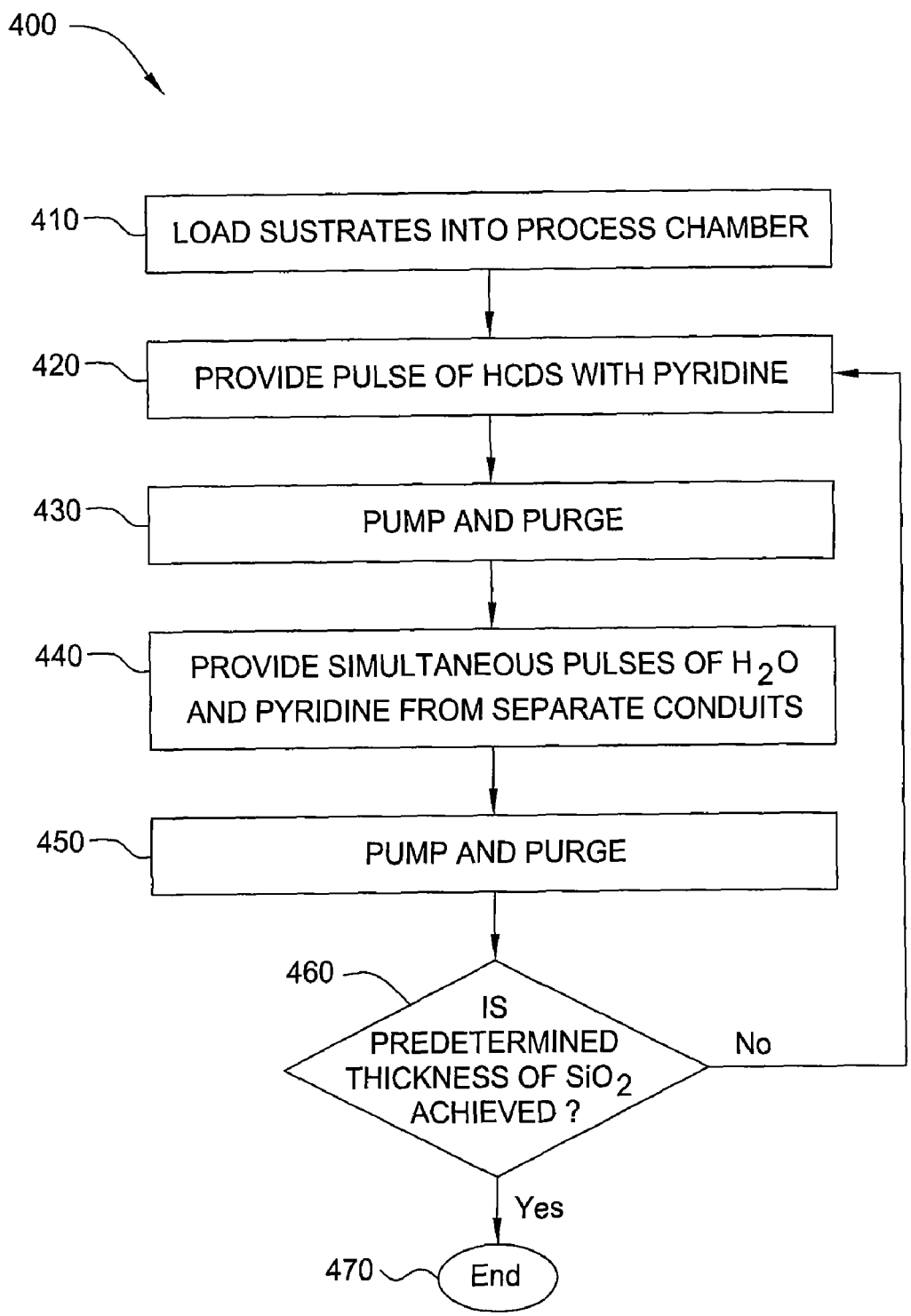
FIG. 4 is a flow chart 400 of a deposition method according to yet another embodiment of the invention.

FIG. 4 is a flow chart 400 of a deposition method according to yet another embodiment of the invention. Initially, one or more substrates may be placed into the process chamber (Step 410). The substrates may then be exposed to a pulse of HCDS and pyridine (Step 420). Following the pulse of HCDS and pyridine, the chamber may be purged by introducing a purge gas into the chamber (Step 430) in a manner as described above.

Following the pumping and/or purging, the substrate may be exposed to simultaneous pulses of $H_2O$ and pyridine (Step 440). The $H_2O$ and the pyridine may be co-flowed through different conduit lines and into the chamber through different inlets. By utilizing different conduits and different inlets, the $H_2O$ and pyridine may not be exposed to each other until they reach the chamber. If the pyridine and the $H_2O$ are co-flowed through the same conduit, the pyridine and the $H_2O$ may interact prior to reaching the chamber. When the $H_2O$ and the pyridine interact prior to entering the chamber, the effectiveness of the pyridine as a catalyst may be reduced so as to render the catalyst useless.

Following the exposure of the substrate to $H_2O$, a second pumping and/or purging cycle (Step 450) may be performed under conditions as discussed above. After the chamber has been pumped and/or purged, the thickness of the $SiO_2$ layer may be measured to determine if the predetermined thickness of $SiO_2$ has been reached (Step 460). If the predetermined thickness has not been reached, the deposition sequence may be repeated. If the predetermined thickness has been reached, then the process ends (Step 470).

Figure 5:
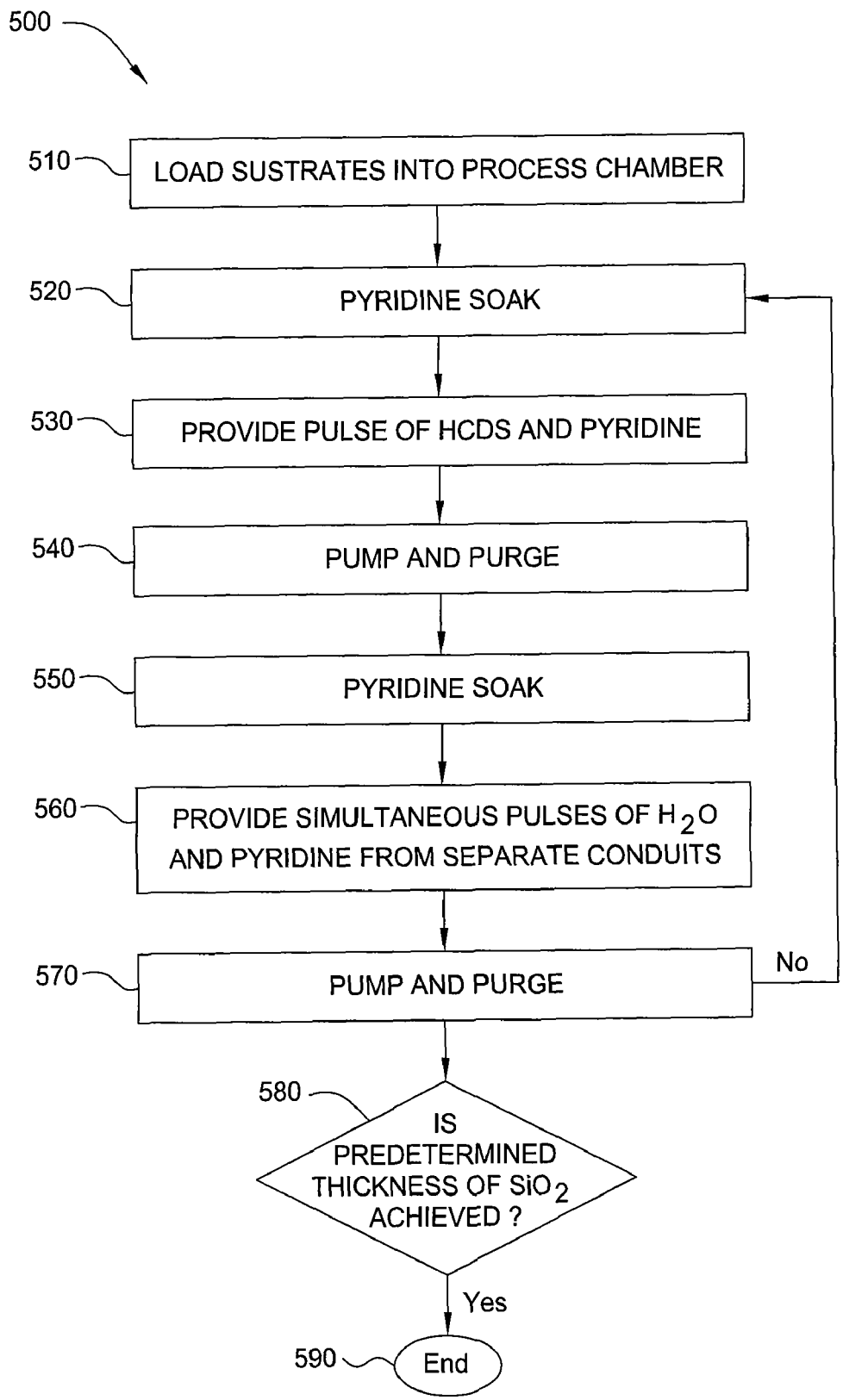
FIG. 5 is a flow chart 500 of a deposition method according to still another embodiment of the invention.

FIG. 5 is a flow chart 500 of a deposition method according to still another embodiment of the invention. Initially, one or more substrates may be placed into the process chamber (Step 510). The substrates may then be exposed to a pyridine soak (Step 520). The pyridine soak may occur for at least 10 seconds. Following the pyridine soak, a pulse of HCDS may be introduced to the chamber while the pyridine continues to flow into the chamber (Step 530). Alternatively, the pyridine flow may be stopped after the pyridine soak and then pulsed into the chamber with the HCDS. Following the pulse of HCDS, the chamber may be purged and/or pumped as described above (Step 540).

Following the pumping and/or purging, the substrate may be exposed to a second pyridine soak (Step 550). The second pyridine soak may occur under the same processing conditions present for the first pyridine soak discussed above. Following the pyridine soak, a pulse of $H_2O$ may be introduced to the chamber while the pyridine continues to flow into the chamber (Step 560). Alternatively, the pyridine flow may be stopped after the pyridine soak and then pulsed into the chamber with the $H_2O$. In one embodiment, the pyridine and the $H_2O$ are fed through separate conduits as discussed above in relation to FIG. 4. Following the exposure of the substrate to $H_2O$, a second pumping and/or purging cycle (Step 570) may be performed under conditions as discussed above.

After the chamber has been pumped and/or purged, the thickness of the $SiO_2$ layer may be measured to determine if the predetermined thickness of $SiO_2$ has been reached (Step 580). If the predetermined thickness has not been reached, the deposition sequence may be repeated. If the predetermined thickness has been reached, then the process ends (Step 590).

It should be understood that when reference is made to processing a substrate, multiple substrates may be processed. For example, about 2 substrates, about 25 substrates, about 50 substrates, or about 100 substrates may be processed in a batch chamber. Additionally, the pyridine soak may occur for a time period of about 1 second to about 90 minutes or about 1 minute to about 20 minutes. Alternatively, the pyridine soak may occur for about 30 seconds to about 60 minutes to about 20 minutes to about 40 minutes. In still another alternative, the pyridine soak may occur for about 1 minute to about 40 minutes.

By providing a pyridine soak and/or co-flowing pyridine and $H_2O$ through separate conduit lines, sufficient pyridine reaches the chamber and hence, the substrate surface, to ensure that pyridine acts as a catalyst. By utilizing pyridine as a catalyst in an $H_2O$ oxidizing atmosphere, $SiO_2$ ALD may occur at an increased rate below 160 degrees C.

While the foregoing is directed to embodiments of the present invention, other and further embodiments of the invention may be devised without departing from the basic scope thereof, and the scope thereof is determined by the claims that follow.

The invention claimed is:

1. A silicon dioxide deposition method, sequentially comprising:
   positioning at least one substrate in a chamber;
   exposing the at least one substrate to a first pyridine soak;
   exposing the at least one substrate to a silicon precursor;
   exposing the at least one substrate to a second pyridine soak; and
   exposing the at least one substrate to an oxidizing source.

2. The method of claim 1, further comprising purging the chamber after the exposing the at least one substrate to a silicon precursor.

3. The method of claim 1, wherein the silicon precursor is hexachlorodisilane.

4. The method of claim 3, wherein the exposing the at least one substrate to a first pyridine soak occurs for at least about 10 seconds.

5. The method of claim 3, wherein the oxidizing source comprises water.

6. The method of claim 1, further comprising measuring a thickness of a silicon dioxide layer disposed on the substrate and determining if the measured thickness is equal to a predetermined thickness.

7. The method of claim 1, wherein the at least one substrate comprises 25 substrates.

8. The method of claim 1, wherein a temperature of the at least one substrate is below about 160° C.

9. The method of claim 8, wherein the temperature is about 75° C.

10. A silicon dioxide deposition method, sequentially comprising:
    positioning at least one substrate in a chamber;
    exposing the at least one substrate to a first pyridine soak;
    exposing the at least one substrate to a silicon precursor;
    purging the chamber;
    exposing the at least one substrate to a second pyridine soak;
    exposing the at least substrate to an oxidizing source;
    purging the chamber;
    exposing the at least one substrate to a third pyridine soak;
    exposing the at least one substrate to the silicon precursor;
    purging the chamber;
    exposing the at least one substrate to a fourth pyridine soak; and
    exposing the at least substrate to the oxidizing source.

11. The method of claim 10, wherein the exposing the at least one substrate to a first pyridine soak occurs for at least about 10 seconds.

12. The method of claim 11, wherein the oxidizing source comprises water and the silicon precursor comprises hexachlorodisilane.

13. The method of claim 11, wherein the oxidizing source comprises ozone.

14. The method of claim 11, wherein the oxidizing source comprises oxygen.

15. The method of claim 11, wherein a temperature of the at least one substrate is below about 160° C.

16. A silicon dioxide deposition method, sequentially comprising:
    (a) positioning at least one substrate in a chamber;
    (b) exposing the at least one substrate to a first pyridine soak;
    (c) exposing the at least one substrate to a silicon precursor; and
    (d) exposing the at least one substrate to pyridine and an oxidizing source, the pyridine and the oxidizing source flowing into the chamber through separate inlets.

17. The method of claim 16, wherein a temperature of the at least one substrate is below about 160° C.

18. The method of claim 17, wherein the at least one substrate comprises about 50 substrates.

19. The method of claim 18, wherein the silicon precursor comprises silane, and the oxidizing source comprises water.

20. The method of claim 19, further comprising repeating (b)-(d) at least one time.

* * * * *